(12) United States Patent
Ziemba et al.

(10) Patent No.: US 11,551,908 B2
(45) Date of Patent: Jan. 10, 2023

(54) SPATIALLY VARIABLE WAFER BIAS POWER SYSTEM

(71) Applicant: Eagle Harbor Technologies, Inc., Seattle, WA (US)

(72) Inventors: Timothy Ziemba, Bainbridge Island, WA (US); Ilia Slobodov, Seattle, WA (US); John Carscadden, Seattle, WA (US); Kenneth Miller, Seattle, WA (US); James Prager, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 17/359,498

(22) Filed: Jun. 25, 2021

(65) Prior Publication Data

US 2021/0327682 A1 Oct. 21, 2021

Related U.S. Application Data

(63) Continuation of application No. 16/721,396, filed on Dec. 19, 2019, now Pat. No. 11,075,058, which is a
(Continued)

(51) Int. Cl.
*H01J 37/32* (2006.01)
*H01L 21/683* (2006.01)
(Continued)

(52) U.S. Cl.
CPC .. *H01J 37/32146* (2013.01); *H01J 37/32082* (2013.01); *H01J 37/32091* (2013.01); *H01J 37/32128* (2013.01); *H01J 37/32174* (2013.01); *H01J 37/32541* (2013.01); *H01J 37/32568* (2013.01); *H01J 37/32715* (2013.01); *H01L 21/6833* (2013.01); *H01L 21/68757* (2013.01); *H02M 3/33523* (2013.01); *H03K 3/57* (2013.01); *H03M 1/12* (2013.01); *H05K 7/20154* (2013.01); *H05K 7/20172* (2013.01);
(Continued)

(58) Field of Classification Search
CPC ........... H01J 37/32146; H01J 37/32128; H01J 37/32541; H01J 37/32174; H01J 37/32568; H01J 37/32091; H01L 21/68757
USPC ....................................................... 361/234
See application file for complete search history.

(56) References Cited

U.S. PATENT DOCUMENTS 10,373,804 B2 * 8/2019 Koh .................. H01J 37/32045
10,510,575 B2 * 12/2019 Kraus .................... H01J 37/00
(Continued)

*Primary Examiner* — Dharti H Patel

(57) ABSTRACT

A plasma deposition system comprising a wafer platform, a second electrode, a first electrode, a first high voltage pulser, and a second high voltage pulser. In some embodiments, the second electrode may be disposed proximate with the wafer platform. In some embodiments, the second electrode can include a disc shape with a central aperture; a central axis, an aperture diameter, and an outer diameter. In some embodiments, the first electrode may be disposed proximate with the wafer platform and within the central aperture of the second electrode. In some embodiments, the first electrode can include a disc shape, a central axis, and an outer diameter. In some embodiments, the first high voltage pulser can be electrically coupled with the first electrode. In some embodiments, the second high voltage pulser can be electrically coupled with the second electrode.

26 Claims, 9 Drawing Sheets

Related U.S. Application Data continuation of application No. 16/524,967, filed on Jul. 29, 2019, now Pat. No. 10,811,230, which is a continuation-in-part of application No. 16/523,840, filed on Jul. 26, 2019, now Pat. No. 10,892,140.

(60) Provisional application No. 62/789,523, filed on Jan. 8, 2019, provisional application No. 62/789,523, filed on Jan. 8, 2019, provisional application No. 62/789,526, filed on Jan. 8, 2019, provisional application No. 62/789,526, filed on Jan. 8, 2019, provisional application No. 62/717,523, filed on Aug. 10, 2018, provisional application No. 62/717,523, filed on Aug. 10, 2018, provisional application No. 62/711,334, filed on Jul. 27, 2018, provisional application No. 62/711,347, filed on Jul. 27, 2018, provisional application No. 62/711,457, filed on Jul. 27, 2018, provisional application No. 62/711,468, filed on Jul. 27, 2018, provisional application No. 62/711,464, filed on Jul. 27, 2018, provisional application No. 62/711,464, filed on Jul. 27, 2018, provisional application No. 62/711,406, filed on Jul. 27, 2018, provisional application No. 62/711,467, filed on Jul. 27, 2018, provisional application No. 62/711,334, filed on Jul. 27, 2018, provisional application No. 62/711,467, filed on Jul. 27, 2018, provisional application No. 62/711,468, filed on Jul. 27, 2018, provisional application No. 62/711,406, filed on Jul. 27, 2018, provisional application No. 62/711,347, filed on Jul. 27, 2018, provisional application No. 62/711,457, filed on Jul. 27, 2018.

(51) Int. Cl.
*H01L 21/687* (2006.01)
*H02M 3/335* (2006.01)
*H03K 3/57* (2006.01)
*H05K 7/20* (2006.01)
*H03M 1/12* (2006.01)

(52) U.S. Cl.
CPC ..... *H05K 7/20254* (2013.01); *H05K 7/20272* (2013.01); *H05K 7/20281* (2013.01); *H05K 7/20509* (2013.01)

(56) References Cited

U.S. PATENT DOCUMENTS

| | | | | |
|---|---|---|---|---|
| 10,811,230 | B2* | 10/2020 | Ziemba | H05K 7/20172 |
| 2012/0228263 | A1* | 9/2012 | Ui | H01J 37/32146 |
| | | | | 156/345.44 |
| 2013/0213935 | A1* | 8/2013 | Liao | H01J 37/32165 |
| | | | | 216/67 |
| 2016/0020072 | A1* | 1/2016 | Brouk | H01J 37/32174 |
| | | | | 156/345.28 |
| 2019/0228952 | A1* | 7/2019 | Dorf | H01L 21/6833 |
| 2019/0326092 | A1* | 10/2019 | Ogasawara | H01J 37/32091 |

* cited by examiner

SPATIALLY VARIABLE WAFER BIAS POWER SYSTEM

CROSS-REFERENCE TO RELATED APPLICATIONS

This application claims priority to U.S. Provisional Patent Application No. 62/711,464 filed Jul. 27, 2018, titled "NANOSECOND PULSER SYSTEM," which is incorporated by reference in its entirety.

This application claims priority to U.S. Provisional Patent Application No. 62/711,334 filed Jul. 27, 2018, titled "NANOSECOND PULSER THERMAL MANAGEMENT," which is incorporated by reference in its entirety.

This application claims priority to U.S. Provisional Patent Application No. 62/711,457 filed Jul. 27, 2018, titled "NANOSECOND PULSER PULSE GENERATION," which is incorporated by reference in its entirety.

This application claims priority to U.S. Provisional Patent Application No. 62/711,347 filed Jul. 27, 2018, titled "NANOSECOND PULSER ADC SYSTEM," which is incorporated by reference in its entirety.

This application claims priority to U.S. Provisional Patent Application No. 62/711,467 filed Jul. 27, 2018, titled "EDGE RING POWER SYSTEM," which is incorporated by reference in its entirety.

This application claims priority to U.S. Provisional Patent Application No. 62/711,406 filed Jul. 27, 2018, titled "NANOSECOND PULSER BIAS COMPENSATION," which is incorporated by reference in its entirety.

This application claims priority to U.S. Provisional Patent Application No. 62/711,468 filed Jul. 27, 2018, titled "NANOSECOND PULSER CONTROL MODULE," which is incorporated by reference in its entirety.

This application claims priority to U.S. Provisional Patent Application No. 62/711,523 filed Aug. 10, 2018, titled "PLASMA SHEATH CONTROL FOR RF PLASMA REACTORS," which is incorporated by reference in its entirety.

This application claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," which is incorporated by reference in its entirety.

This application claims priority to U.S. Provisional Patent Application No. 62/789,526 filed Jan. 1, 2019, titled "EFFICIENT ENERGY RECOVERY IN A NANOSECOND PULSER CIRCUIT," which is incorporated by reference in its entirety.

This application claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{11}$ V/s). Such steep rise times and/or fall times are very difficult to produce especially in circuits driving a load with low capacitance. Such pulses may be especially difficult to produce using standard electrical components in a compact manner; and/or with pulses having variable pulse widths, voltages, and repetition rates; and/or within applications having capacitive loads such as, for example, a plasma.

In addition, wafer yield can determine whether a process was successful. Often, chips on the edge of a wafer may not be usable because of various defects that may occur at the edge of a wafer. These defects increase waste and decrease wafer yield.

SUMMARY

Some embodiments of the invention include a spatially variable wafer bias system that may include a first high voltage pulser, a second high voltage pulser, a chamber, a first electrode, and a second electrode. In some embodiments, the first high voltage pulser may output a first plurality of pulses having a first voltage greater than about 1 kV, a first pulse width less than about 1 µs, and a first pulse repletion frequency greater than about 20 kHz. In some embodiments, the second high voltage pulser may output a second plurality of pulses having a second voltage greater than about 1 kV, a second pulse width less than about 1 µs, and a second pulse repletion frequency greater than about 20 kHz. In some embodiments, the first electrode may be disposed within the chamber and electrically coupled with the first high voltage pulser; and the second electrode may be disposed within the chamber adjacent with the first electrode and electrically coupled with the second high voltage pulser.

In some embodiments, the chamber includes either or both a wafer and a plasma may be capacitively coupled with the first electrode and the second electrode with a capacitance between 10 pF and 1 µF.

In some embodiments, an electric field across the surface of the wafer may be uniform by less than 25%, 20%, 15%, 10%, 5% or 2% or better using a first nanosecond pulser and a second nanosecond pulser.

In some embodiments, the capacitance between the first electrode and a corresponding portion of the wafer is greater than 100 pF; and the capacitance between the second electrode and a corresponding portion of the wafer is greater than 100 pF.

In some embodiments, the chamber may include a plasma of ions that are accelerated onto a wafer.

In some embodiments, the first high voltage pulser produces an electrode voltage on the first electrode that is greater than about 1 kV, and the second high voltage pulser produces an electrode voltage on the second electrode that is greater than about 1 kV. In some embodiments, the ratio of the first voltage relative to the second voltage is less than two to one or vice versa.

In some embodiments, either or both the first electrode and the second electrode are axially symmetric.

In some embodiments, the first electrode has a first planar surface and the second electrode has a second planar surface such that the second planar surface area is about 25% of the total of the first planar surface and the second planar surface.

In some embodiments, both the first the first high voltage pulser and the second high voltage pulser comprise a resistive output stage. In some embodiments, both the first high voltage pulser and the second high voltage pulser comprise an energy recovery circuit.

In some embodiments, the parameters of the first plurality of pulses are controlled independently of the parameters of the second plurality of pulses. In some embodiments, the first pulse repetion frequency and the second pulse repetition frequency are in phase with respect of each other.

In some embodiments, the capacitance between the first electrode and the second electrode is less than about 10 nF.

In some embodiments, the first electrode comprises: a disc shape, a central axis, and an outer diameter. In some embodiments, the second electrode comprises: a disc shape with a central aperture, the first electrode disposed within the central aperture; a central axis aligned with the central axis of the first electrode, an aperture diameter, and an outer diameter.

Some embodiments of the invention include a spatially variable wafer bias system that may include a wafer platform, a first electrode, a second electrode, a first high voltage pulser, and a second high voltage pulser. In some embodiments, the first electrode may include a disc shape, a central axis, and an outer diameter. In some embodiments, the second electrode may include a disc shape with a central aperture, the first electrode disposed within the central aperture; a central axis aligned with the central axis of the first electrode, an aperture diameter, and an outer diameter. In some embodiments, the first high voltage pulser may be electrically coupled with the first electrode, and the first high voltage pulser may produce pulses greater than 5 kV with a pulse repetition rate greater than 10 kHz. In some embodiments, the second high voltage pulser may be electrically coupled with the second electrode, and the second high voltage pulser may produce pulses greater than 5 kV with a pulse repetition rate greater than 10 kHz.

In some embodiments, the second high voltage pulser provides pulses with an amplitude that is a fraction of the amplitude of the pulses provided by the first high voltage pulser. In some embodiments, the second high voltage pulser provides pulses with a pulse repetition frequency that is a fraction of the pulse repetition frequency of the pulses provided by the first high voltage pulser.

In some embodiments, the spatially variable wafer bias system may also include a first resistive output stage coupled with the first high voltage pulser and the first electrode; and a second resistive output stage coupled with the second high voltage pulser and the second electrode. In some embodiments, the spatially variable wafer bias system may also include a bias compensation circuit coupled with the first high voltage pulser and the first electrode.

In some embodiments, the spatially variable wafer bias system may also include a ring of insulating material disposed between the first electrode and the second electrode. In some embodiments, the wafer platform comprises a dielectric material or a ceramic material. In some embodiments, the wafer platform has an outer diameter that is substantially similar to the outer diameter of the second electrode.

Some embodiments may include a method that may include pulsing a first high voltage pulser coupled with a first electrode in a plasma chamber, the first high voltage pulser pulsing at a first voltage greater than about 1 kV, with a first pulse repetition frequency greater than about 20 kHz, and with a first pulse width; pulsing a second high voltage pulser coupled with a second electrode in the plasma chamber, the second high voltage pulser pulsing at a second voltage greater than about 1 kV, with a second pulse repetition frequency greater than about 20 kHz, and with a second pulse width. In some embodiments, the first electrode and the second electrode are disposed beneath a wafer. The method may also include measuring a parameter corresponding with a physical phenomenon occurring within the plasma chamber (e.g., chuck voltage, electrode voltage, electric filed uniformity, ion current, etc.). And adjusting at least one of the second voltage, the second pulse repetition frequency, and the second pulser width an amount based on the measured parameter.

In some embodiments, the voltages or currents measured at various locations within the plasma chamber correspond with the uniformity of the electric field across a surface of the wafer.

In some embodiments, the voltages or currents measured at various locations within the plasma chamber correspond with the uniformity of the ion current across a surface of the wafer.

In some embodiments, the parameter is the current flowing through a resistor in either a resistive output stage or an energy recovery circuit.

Some embodiments of the invention include a spatially variable wafer bias system. For example, a wafer bias system may include a system comprising: a disc-shaped wafer platform; a first electrode having a disc shape disposed proximate and aligned with the wafer platform; a second electrode having a disc shape and central aperture disposed proximate and aligned with the wafer platform such that the first electrode is disposed within the central aperture; a first high voltage pulser electrically coupled with the first electrode; and a second high voltage pulser electrically coupled with the second electrode.

In some embodiments, the second high voltage pulser provides pulses with an amplitude that is a fraction of the amplitude of the pulses provided by the first high voltage pulser. The fraction, for example, may include 50%, 75%, 100%, 125%, 150%, 200%, etc.

In some embodiments, the system further includes a first resistive output stage coupled with the first high voltage pulser and the first electrode.

In some embodiments, the system further includes a second resistive output stage coupled with the second high voltage pulser and the second electrode.

In some embodiments, the system further includes a bias capacitor coupled with the first high voltage pulser and the first electrode.

In some embodiments, the system further includes a bias capacitor coupled with the first high voltage pulser and the second electrode.

In some embodiments, the first high voltage pulser comprises one or more nanosecond pulsers. In some embodiments, the second high voltage pulser comprises one or more nanosecond pulsers.

Some embodiments include a plasma deposition system comprising a wafer platform, a first electrode, a second electrode, a first high voltage pulser, and a second high voltage pulser. In some embodiments, the second electrode may be disposed beneath the wafer platform. In some embodiments, the second electrode can include a disc shape with a central aperture; a central axis, an aperture diameter, and an outer diameter. In some embodiments, the first electrode may be disposed beneath the wafer platform and within the central aperture of the second electrode. In some embodiments, the first electrode can include a disc shape, a central axis, and an outer diameter. In some embodiments, the first high voltage pulser can be electrically coupled with the first electrode. In some embodiments, the first high voltage pulser can produce pulses greater than 5 kV with a pulse repetition rate greater than 10 kHz. In some embodiments, the second high voltage pulser can be electrically coupled with the second electrode. In some embodiments, the second high voltage pulser can produce pulses greater than 5 kV with a pulse repetition rate greater than 10 kHz.

Some embodiments include a plasma deposition system comprising a wafer platform having a first platform region and a second platform region; a first electrode disposed beneath the first platform region of the wafer platform; a second electrode disposed beneath the second platform region of the wafer platform; a first high voltage pulser electrically coupled with the first electrode, the first high voltage pulser producing pulses greater than 2 kV with a pulse repetition rate greater than 10 kHz; and a second high voltage pulser electrically coupled with the second electrode, the second high voltage pulser producing pulses greater than 2 kV with a pulse repetition rate greater than 10 kHz.

In some embodiments, the second high voltage pulser provides pulses with an amplitude that is a fraction of the amplitude of the pulses provided by the first high voltage pulser.

In some embodiments, the second high voltage pulser provides pulses with a pulse repetition frequency that is a fraction of the pulse repetition frequency of the pulses provided by the first high voltage pulser.

In some embodiments, the first high voltage pulser or the second high voltage pulser comprises one or more nanosecond pulsers.

In some embodiments, the first high voltage pulser or the second high voltage pulser comprises one or more high voltage switches.

Some embodiments include a system comprising: a wafer platform; a plurality of electrodes disposed beneath the wafer platform; and a plurality of high voltage pulsers electrically coupled with a respective one of the plurality of electrodes, each of the plurality of high voltage pulsers producing pulses greater than 5 kV with a pulse repetition rate greater than 10 kHz. In some embodiments, each of the plurality of electrodes are separated from each other with insulation. In some embodiments, each of the plurality of high voltage pulsers produce pulses with either or both different voltages or pulse repetition rates.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DISCLOSURE

Systems and methods are disclosed to produce different high voltage pulses on different electrodes. For example, each of a plurality of pulse generators (e.g., nanosecond pulsers, RF generators, or HV switches) can be electrically coupled with a respective one of a plurality of electrodes. The plurality of pulse generators can produce a different voltage, ion energy, or electric field on the electrodes. This can be done for any number of reasons such, for example, to compensate for plasma chamber defects, wafer discontinuities, or reduce wafer edge defects. In one example, the plurality of pulse generators systems may be used to produce a different electric field profile at the edge of a wafer than in the middle of the wafer.

Figure 1:
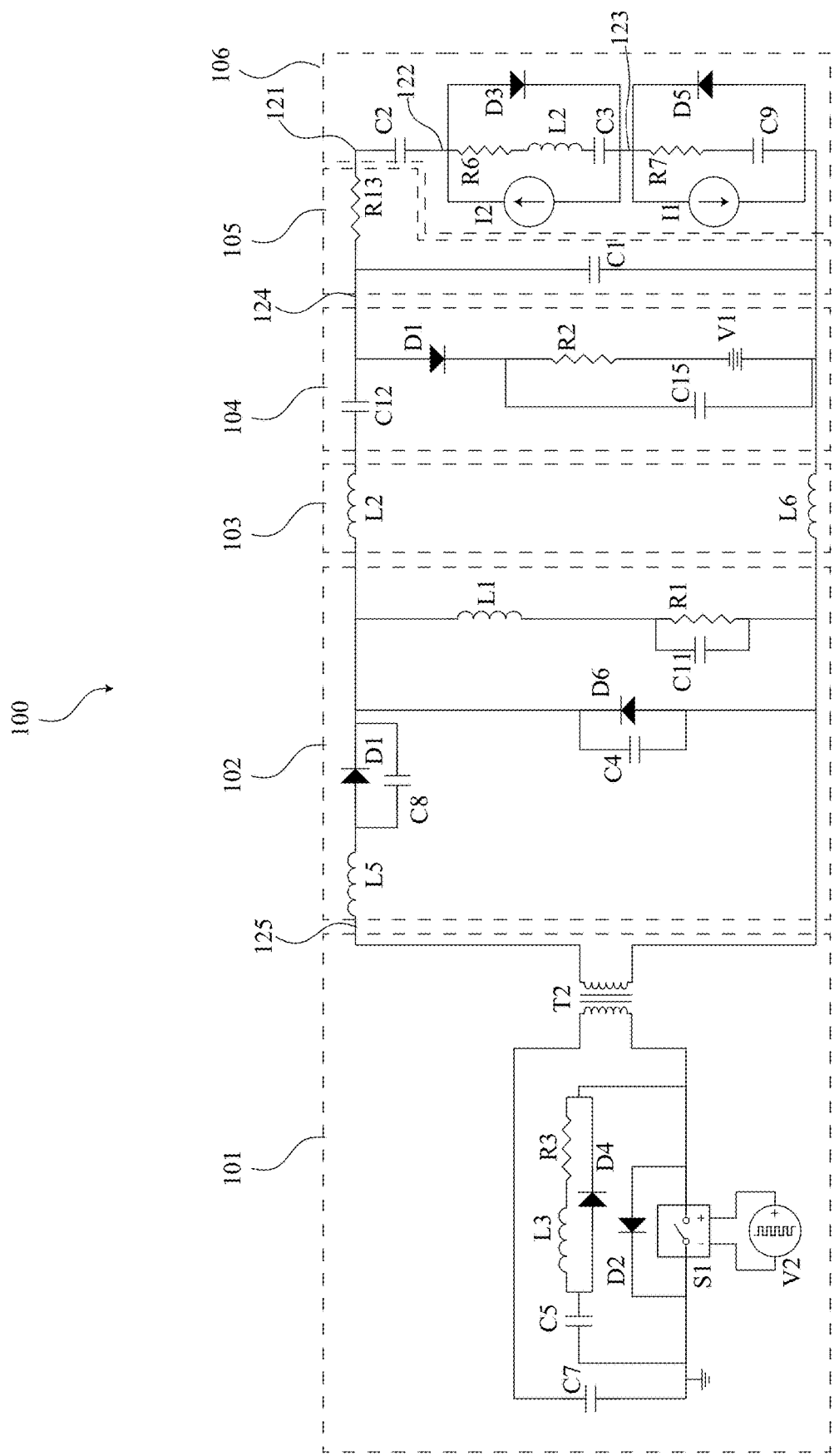
FIG. 1 is a circuit diagram of a nanosecond pulser according to some embodiments.

FIG. 1 is a circuit diagram of a nanosecond pulser system 100 according to some embodiments. The nanosecond pulser system 100 can be implemented within a high voltage nanosecond pulser system. The nanosecond pulser system 100 can be generalized into five stages (these stages could be broken down into other stages or generalized into fewer stages and/or may or may not include the components shown in the figure). The nanosecond pulser system 100 includes a pulser and transformer stage 101, a resistive output stage 102, a lead stage 103, a DC bias compensation circuit 104, and a load stage 106.

In some embodiments, the nanosecond pulser system 100 can produce pulses from the power supply with voltages greater than 2 kV, with rise times less than about 20 ns, and frequencies greater than about 10 kHz.

In some embodiments, the pulser and transformer stage 101 can produce a plurality of high voltage pulses with a high frequency and fast rise times and fall times. In all of the circuits shown, the high voltage pulser may comprise a nanosecond pulser.

In some embodiments, the pulser and transformer stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.), one or more snubber resistors R3, one or more snubber diodes D4, one or more snubber capacitors C5, and/or one or more freewheeling diodes D2. One or more switches and or circuits can be arranged in parallel or series.

In some embodiments, the load stage 106 may represent an effective circuit for a plasma deposition system, plasma etch system, or plasma sputtering system. The capacitance C2 may represent the capacitance of the dielectric material upon which a wafer may sit or capacitance C2 may represent the capacitance between an electrode and a wafer which are separated by a dielectric material. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the plasma sheaths.

In some embodiments, the resistive output stage 102 may include one or more inductive elements represented by inductor L1 and/or inductor L5. The inductor L5, for example, may represent the stray inductance of the leads in the resistive output stage 102. Inductor L1 may be set to minimize the power that flows directly from the pulser and transformer stage 101 into resistor R1.

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 5 nF, 2 nF, 1 nF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 101 can be arranged in parallel and coupled with the resistive output stage 102 across the inductor L1 and/or the resistor R1. Each of the plurality of pulser and transformer stages 101 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias compensation circuit 104 may include a DC voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the pulser and transformer stage 101.

In this example, the DC bias compensation circuit 104 is a passive bias compensation circuit and can include a bias compensation diode D1 and a bias compensation capacitor C15. The bias compensation diode C15 can be arranged in series with offset supply voltage V1. The bias compensation capacitor C15 can be arranged across either or both the offset supply voltage V1 and the resistor R2. The bias compensation capacitor C15 can have a capacitance less than 100 nH to 100 µF such as, for example, about 100 µF, 50 µF, 25 µF, 10 µF, 2µ, 500 nH, 200 nH, etc.

In some embodiments, the bias capacitor C12 may allow for a voltage offset between the output of the pulser and transformer stage 101 (e.g., at the position labeled 125) and the voltage on the electrode (e.g., at the position labeled 124). In operation, the electrode may, for example, be at a DC voltage of −2 kV during a burst, while the output of the nanosecond pulser alternates between +6 kV during pulses and 0 kV between pulses.

The bias capacitor C12, for example, 100 nF, 10 nF, 1 nF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor C15 and the bias compensation diode D1 may allow for the voltage offset between the output of the pulser and transformer stage 101 (e.g., at the position labeled 125) and the voltage on the electrode (e.g., at the position labeled 124) to be established at the beginning of each burst, reaching the needed equilibrium state. For example, charge is transferred from bias capacitor C12 into bias compensation capacitor C15 at the beginning of each burst, over the course of a plurality of pulses (e.g., about 5-100 pulses), establishing the correct voltages in the circuit.

In some embodiments, the DC bias compensation circuit 104 may include one or more high voltage switches placed across the bias compensation diode D1 and coupled with the power supply V1. In some embodiments, a high voltage switch may include a plurality of switches arranged in series to collectively open and close high voltages.

A high voltage switch may be coupled in series with either or both an inductor and a resistor. The inductor may limit peak current through high voltage switch. The inductor, for example, may have an inductance less than about 100 µH such as, for example, about 250 µH, 100 µH, 50 µH, 25 µH, 10 µH, 5 µH, 1 µH, etc. The resistor, for example, may shift power dissipation to the resistive output stage 102. The resistance of resistor may have a resistance of less than about 1,000 ohms, 500 ohms, 250 ohms, 100 ohms, 50 ohms, 10 ohms, etc.

In some embodiments, a high voltage switch may include a snubber circuit.

In some embodiments, the high voltage switch may include a plurality of switches arranged in series to collectively open and close high voltages. For example, the high voltage switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, a high voltage switch may be open while the pulser and transformer stage 101 is pulsing and closed when the pulser and transformer stage 101 is not pulsing. When the high voltage switch is closed, for example, current can short across the bias compensation diode C15. Shorting this current may allow the bias between the wafer and the chuck to be less than 2 kV, which may be within acceptable tolerances.

In some embodiments, the pulser and transformer stage 101 can produce pulses having a high pulse voltage (e.g., voltages greater than 1 kV, 10 kV, 20 kV, 50 kV, 100 kV, etc.), high pulse repetition frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Figure 2:
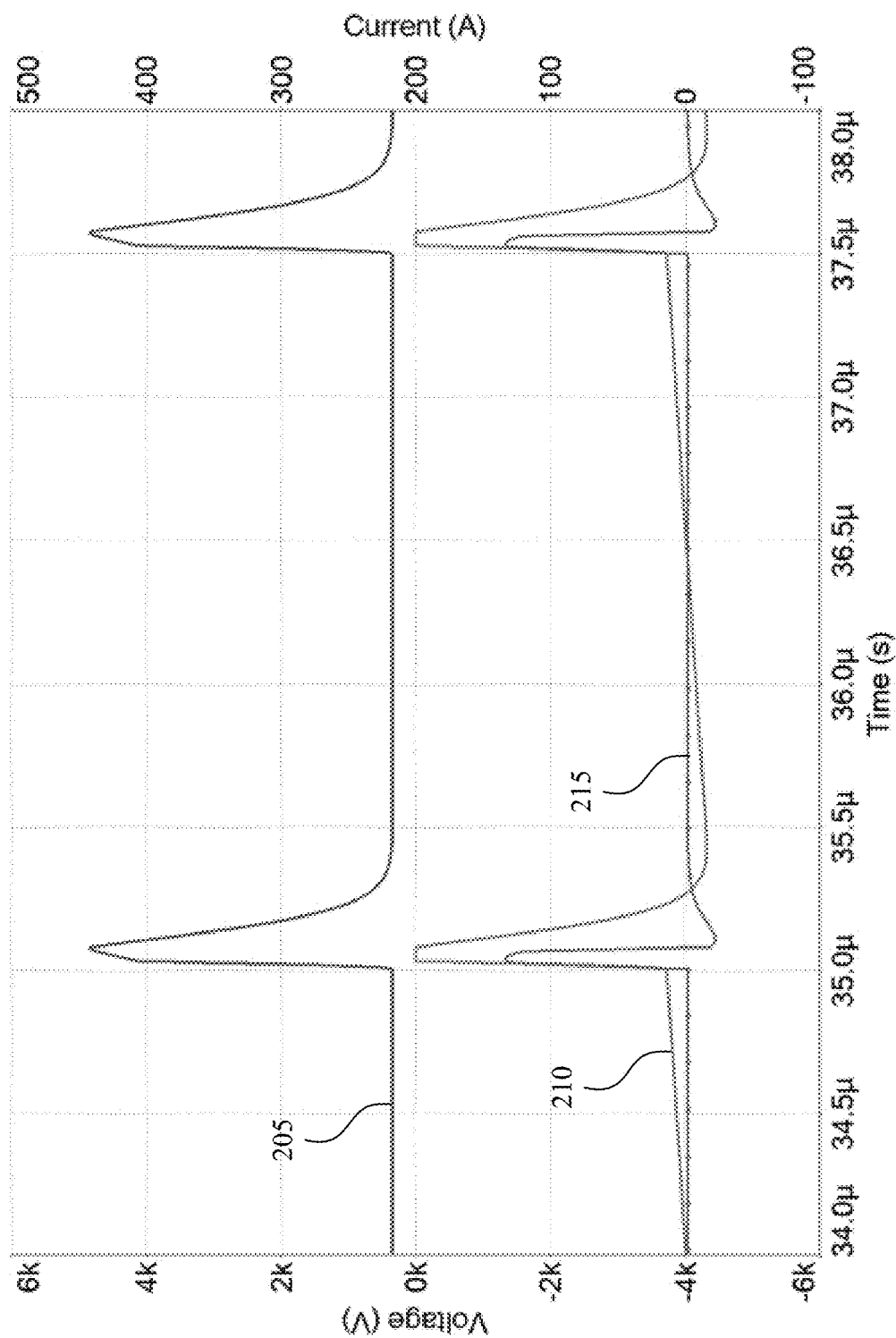
FIG. 2 shows example waveforms produced by the nanosecond pulser.

FIG. 2 shows example waveforms produced by the nanosecond pulser system 100. In these example waveforms, the pulse waveform 205 may represent the voltage provided by the pulser and transformer stage 101. As shown, the pulse waveform 205 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at the surface of a wafer represented in the circuit shown in FIG. 1 by the point between capacitor C2 and capacitor C3 or the voltage across capacitor C3. The pulse waveform 215 represent the current flowing from the pulser and transformer stage 101 to the plasma. The nanosecond pulser system 100 may or may not include either or both diodes D1 or D2.

During the transient state (e.g., during an initial number of pulses not shown in the figure), the high voltage pulses from the pulser and transformer stage 101 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 2.

In steady state and when the switch S1 is open, the capacitor C2 is charged and slowly dissipates through the resistive output stage 102, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser and transformer stage 101. For the example waveform shown in FIG. 2, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in the pulse waveform 205) as the capacitor C2 is charged. In addition, the voltage at the point between capacitor C2 and capacitor C3 (e.g., at the surface of the wafer) changes to about zero as the capacitor C2 charges, as shown in waveform 210. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 102, that may rapidly discharge the stray capacitance C1, and may allow the voltage at the point between capacitor C2 and capacitor C3 to rapidly return to its steady negative value of about −4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the nanosecond pulser system 100.

Figure 3:
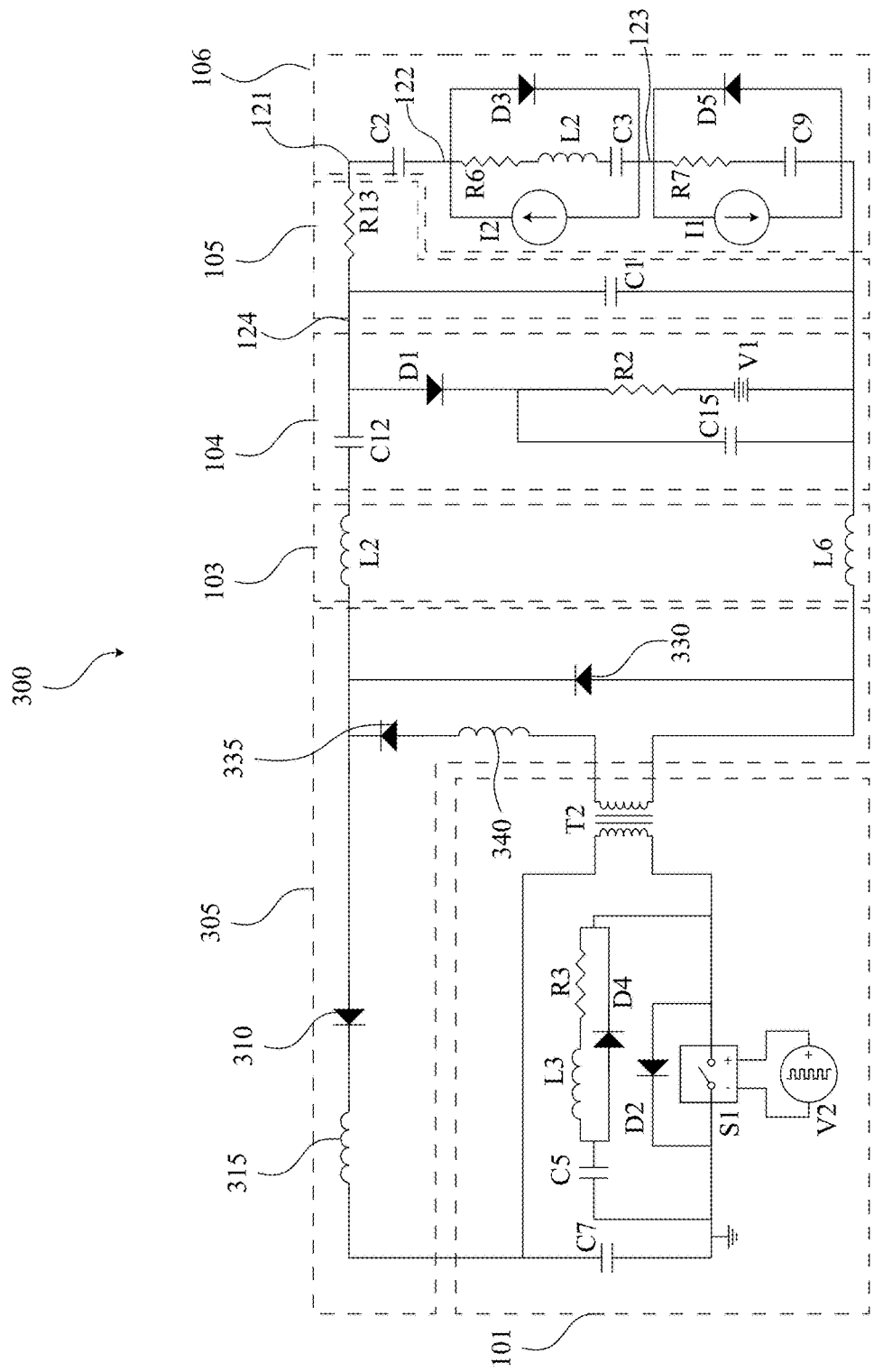
FIG. 3 is another example of a nanosecond pulser according to some embodiments.

FIG. 3 is a circuit diagram of a nanosecond pulser system 300 with the pulser and transformer stage 101 and an energy recovery circuit 305 according to some embodiments. The energy recovery circuit, for example, may replace the resistive output stage 102 shown in FIG. 1. In this example, the energy recovery circuit 305 may be positioned on or electrically coupled with the secondary side of the transformer T1. The energy recovery circuit 305, for example, may include a diode 330 (e.g., a crowbar diode) across the secondary side of the transformer T1. The energy recovery circuit 305, for example, may include diode 310 and inductor 315 (arranged in series), which can allow current to flow from the secondary side of the transformer T1 to charge the power supply C7. The diode 310 and the inductor 315 may be electrically connected with the secondary side of the transformer T1 and the power supply C7. In some embodiments, the energy recovery circuit 305 may include diode 335 and/or inductor 340 electrically coupled with the secondary of the transformer T1. The inductor 340 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 315 when the voltage on the secondary side of the transformer T1 rises above the charge voltage on the power supply C7. When the nanosecond pulser is turned off, current may flow from the capacitors within the load stage 106 through the inductor 315 to charge the power supply C7 until the voltage across the inductor 315 is zero. The diode 330 may prevent the capacitors within the load stage 106 from ringing with the inductance in the load stage 106 or the DC bias compensation circuit 104.

The diode 310 may, for example, prevent charge from flowing from the power supply C7 to the capacitors within the load stage 106.

The value of inductor 315 can be selected to control the current fall time. In some embodiments, the inductor 315 can have an inductance value between 1 μH-500 μH.

In some embodiments, the energy recovery circuit 305 may include an energy recovery switch that can be used to control the flow of current through the inductor 315. The energy recovery switch, for example, may be placed in series with the inductor 315. In some embodiments, the energy recovery switch may be closed when the switch S1 is open and/or no longer pulsing to allow current to flow from the load stage 106 back to the high voltage load C7.

In some embodiments, the energy recovery switch may include a plurality of switches arranged in series to collectively open and close high voltages. For example, the energy recovery switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the nanosecond pulser system 300 may produce similar waveforms as those shown in FIG. 2.

Figure 4A:
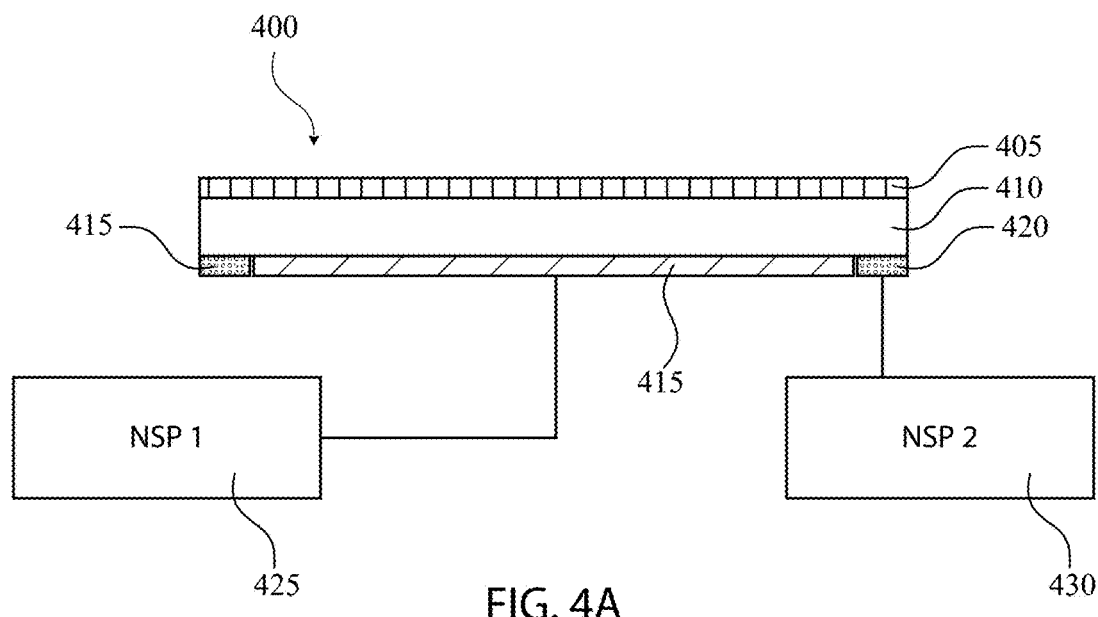
FIG. 4A and FIG. 4B are block diagrams of an spatially variable wafer bias power system according to some embodiments.
Figure 4B:
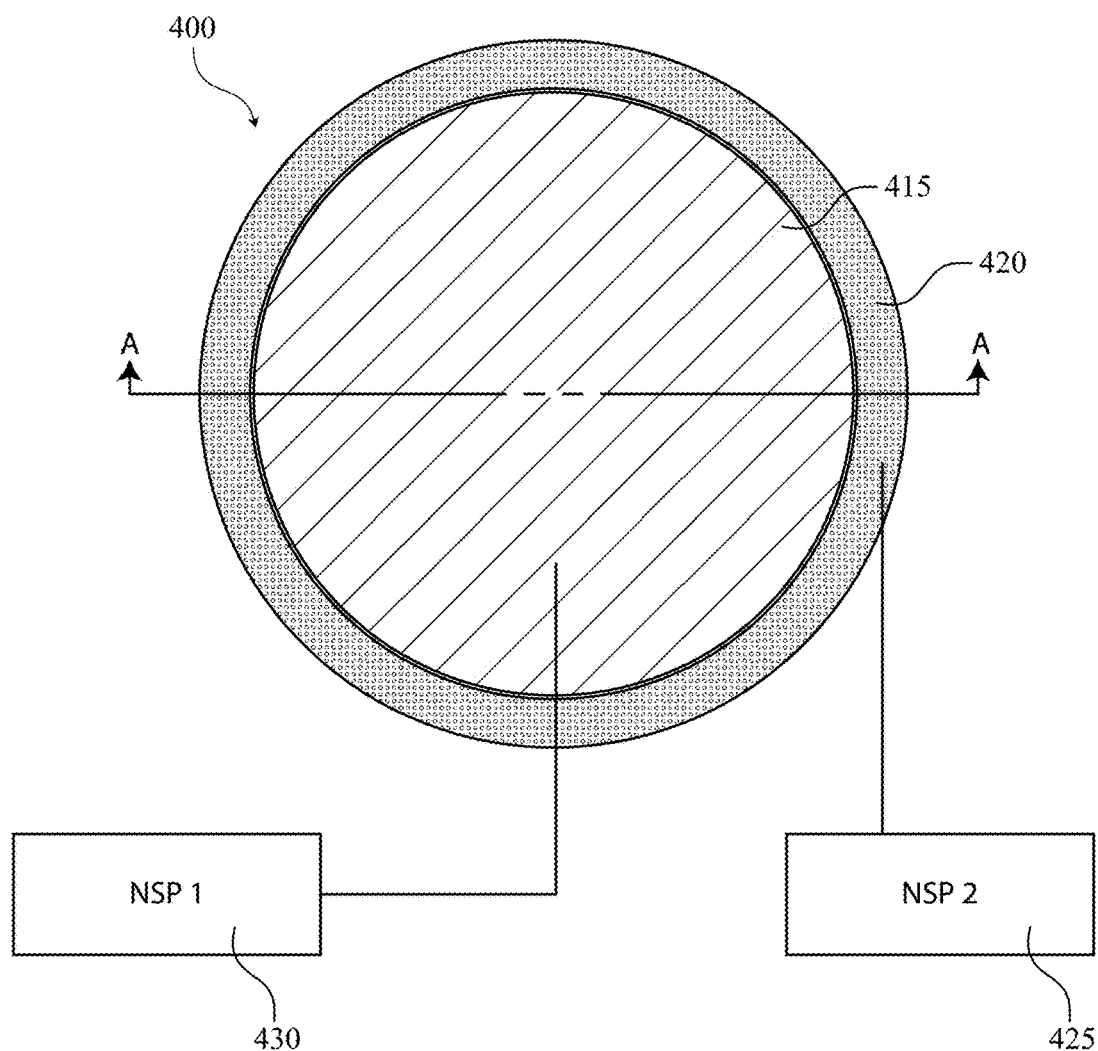

FIG. 4A is a cutaway side view block diagram and FIG. 4B is a top view block diagram of a spatially variable wafer bias power system 400 according to some embodiments. The cutaway side view shown in FIG. 4A is along the line A shown in FIG. B. The spatially variable wafer bias power system 400 includes two electrodes: a first electrode 415 and a second electrode 420. A wafer 405 may be placed on a wafer platform 410 above both the first electrode 415 and the second electrode 420. The wafer platform 410 may comprise a dielectric material such as, for example, a ceramic. The first electrode 415 may be disc shaped with a diameter that is smaller than the diameter of either or both the wafer platform 410 or the wafer 405. The second electrode 420 may have a donut shape with an aperture diameter that is slightly greater than the diameter of the first electrode 415 and an exterior diameter that is substantially similar to either or both the diameter of the wafer platform 410 or the wafer 405. The first electrode 415 may be placed within the aperture of the second electrode 420.

In some embodiments, the gap between the first electrode 415 and the second electrode 420 may be less than about 0.1 mm, 1.0 mm, 5.0 mm, etc. In some embodiments, the space between the first electrode 415 and the second electrode 420 may be filled with air, vacuum, insulating gas, solid dielectric material, or other insulating material.

In some embodiments, the thickness of the first electrode 415 and the second electrode 420 may be substantially the same thickness. In some embodiments, the first electrode 415 and the second electrode 420 may have different thickness.

In some embodiments, the second electrode 420 may have an area that is 5% to 50% of the area of the wafer platform.

In some embodiments, the first electrode 415 and the second electrode 420 may comprise the same material or different material.

In some embodiments, a first high voltage pulser 425 may be coupled with the first electrode 415 and a second high voltage pulser 430 may be coupled with the second electrode 420. For example, the first high voltage pulser 425 and the second high voltage pulser 430 may include the pulser and transformer stage 101 of nanosecond pulser system 100.

In some embodiments, the first high voltage pulser 425 and the second high voltage pulser 430 may provide different pulses. For example, the peak voltage provided by the second high voltage pulser 430 to the second electrode 420 may be different than the peak voltage provided by the first high voltage pulser 425 to the first electrode 415. As another example, the pulse repetition frequency provided by the second high voltage pulser 430 to the second electrode 420 may be different than the pulse repetition frequency provided by the first high voltage pulser 425 to the first electrode 415. As another example, the ion current provided by the second high voltage pulser 430 to the second electrode 420 may be different than the ion current provided by the first high voltage pulser 425 to the first electrode 415.

In some embodiments, the first high voltage pulser 425 and the second high voltage pulser may provide substantially the same pulses. For example, the peak voltage provided by the second high voltage pulser 430 to the second electrode 420 may be substantially the same as the peak voltage provided by the first high voltage pulser 425 to the first electrode 415. As another example, the pulse repetition frequency provided by the second high voltage pulser 430 to the second electrode 420 may be substantially the same as the pulse repetition frequency provided by the first high voltage pulser 425 to the first electrode 415. As another example, the ion current provided by the second high voltage pulser 430 to the second electrode 420 may be substantially the same as the ion current provided by the first high voltage pulser 425 to the first electrode 415.

The first high voltage pulser 425 may include any or all components of the nanosecond pulser system 100. The first high voltage pulser 425 may include any or all components of the nanosecond pulser system 300. In some embodiments, the first high voltage pulser 425 may include any switch described in U.S. patent application Ser. No. 16/178,565, filed Nov. 1, 2018, titled "High Voltage Switch with Isolated Power," which is incorporated into this disclosure in its entirety for all purposes. In some embodiments, the first high voltage pulser 425 may include an RF generator.

The second high voltage pulser 430 may include any or all components of the nanosecond pulser system 100. The second high voltage pulser 430 may include any or all components of the nanosecond pulser system 300. In some embodiments, the second high voltage pulser 430 may include any switch described in U.S. patent application Ser. No. 16/178,565, filed Nov. 1, 2018, titled "High Voltage Switch with Isolated Power," which is incorporated into this disclosure in its entirety for all purposes. In some embodiments, second high voltage pulser 430 may include an RF generator.

In some embodiments, the first high voltage pulser 425 and the second high voltage pulser 430 may provide separately controlled pulse bias voltages or distinct pulse repetition frequencies or pulses that are out of phase such that the voltage pulses applied to the edge of the wafer by the second electrode 420 is distinct from the voltage applied to the center of the wafer by the first electrode 415. Separate voltages may, for example, produce different electric field profiles at the wafer edge compared to center such that the electric field or bias voltage across the wafer 405 is uniform. This may, for example, optimize wafer yield. In some embodiments, the second high voltage pulser 430 may operate at a lower voltage than the first high voltage pulser 425 such as, for example, the second high voltage pulser 430 may operate at 5%, 10%, 15%, 20%, 25%, 30%, etc. of the voltage of the first high voltage pulser 425.

In some embodiments, the pulses provided by the first high voltage pulser 425 may be independently controlled relative to the second high voltage pulser 430.

In some embodiments, the spatially variable wafer bias power system may produce a uniform electric field (e.g., differences less than about 5%, 10%, 15%, or 20%) or uniform voltage across the top of the wafer platform 410 or the wafer 405.

In some embodiments, the spatially variable wafer bias power system may produce a nonuniform electric field or nonuniform voltage across the top of the wafer platform 410 or the wafer 405.

In some embodiments, the first high voltage pulser 425 and the second high voltage pulser 430 may be capacitively coupled with a capacitance between about 1 pF and 100 nF.

In some embodiments, the first high voltage pulser 425 and the second high voltage pulser 430 may be linked. For example, the first high voltage pulser 425 and the second high voltage pulser 430 may comprise a single nanosecond pulser with a voltage divider (e.g., resistive, inductive, or capacitive) that produces different voltages for the first electrode 415 and the second electrode 420. As another example, a single pulser on the primary side of the transformer may be coupled with multiple loads (and energy recovery circuits, resistive output stages, or bias compensation circuits) coupled with different secondary windings on the secondary side of the transformer T2. The different secondary windings may have a different number of windings to produce different voltages.

While two electrodes are shown in FIG. 4A, in some embodiments, any number of electrodes may be used along with any number of nanosecond pulsers. In some embodiments, the first electrode 415 or the second electrode 420 may comprise any geometric region beneath the wafer platform 410 having any geometric shape. Similarly, additional electrodes and nanosecond pulsers may be included and the additional electrodes may have any shape and disposed in any location relative to the other electrodes and relative to the wafer platform.

In some embodiments, the leads from the first high voltage pulser 425 to the first electrode 415 and the leads from the second high voltage pulser 430 to the second electrode 420 may be grouped or bundled together. This bundling, for example, may allow the total stray capacitance to ground of the bundled leads to be less than if each lead was run separately. This bundling, for example, may also conserve power consumption. In some embodiments, the leads may be arranged in a coaxial configuration or in twin lead configuration or as a twisted pair. In some embodiments, the stray capacitance from the outputs to ground may be less than about 100 pF or less than about 1 nF or 10 nF, etc. In some embodiments, the stray inductance of the outputs may be less than about 100 nH, 1 µH, 10 µH, etc. In some embodiments, the capacitive coupling between each output may be less than about 100 pF, 1 nF, 10 nF, etc.

Figure 5:
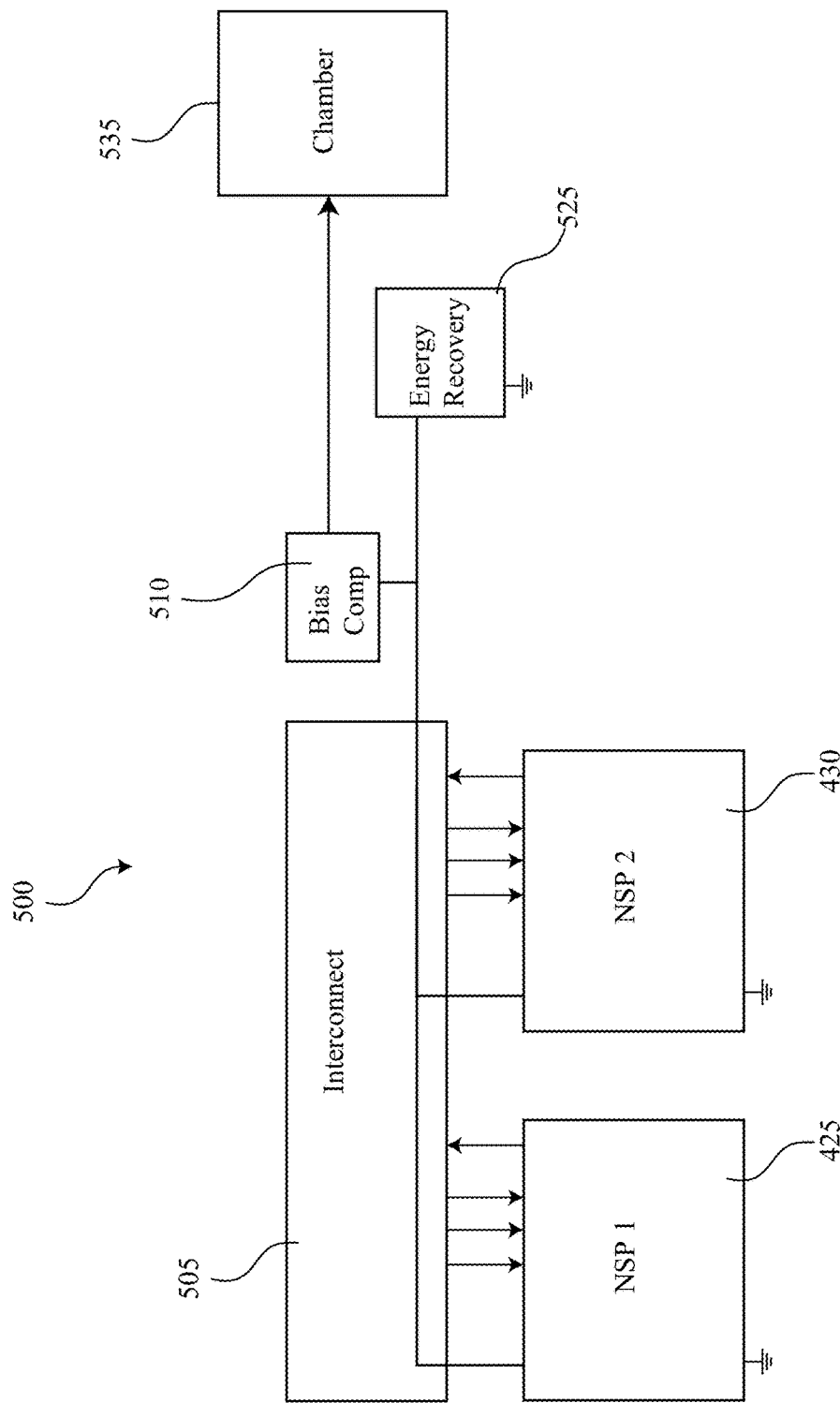
FIG. 5 is a block diagram of a spatially variable wafer bias power system according to some embodiments.

FIG. 5 is a block diagram of a spatially variable wafer bias power system 500 according to some embodiments. The spatially variable wafer bias power system 500 may include the first high voltage pulser 425 and the second high voltage pulser 430.

An interconnect board 505 may be electrically coupled with the first high voltage pulser 425 and the second high voltage pulser 430 or additional high voltage pulsers. In some embodiments, the interconnect board 505 may provide a high DC voltage to each of the first high voltage pulser 425 or the second high voltage pulser 430. In some embodiments, the interconnect board 505 may provide trigger signals to the first high voltage pulser 425 or the second high voltage pulser 430. In some embodiments, the interconnect board 505 may provide low voltage pulses to the first high voltage pulser 425 or the second high voltage pulser 430.

In some embodiments, the interconnect board 505 may include a controller or processor that includes one or more components of computational system 900. In some embodiments, one more sensors may be included that measure a characteristic of the plasma chamber such as, for example, the electric field on the surface of a wafer, the uniformity of an electric field, the voltage on a first electrode 415, the voltage on a second electrode 420, the voltage across a resistor in one or more resistive output stages or one or more energy recovery circuits. Based on the measurement from the sensors, the voltage, pulse width, or pulse repetition frequency of the first high voltage pulser 425 and the second high voltage pulser 430 may be adjusted.

For example, if the voltage on the second electrode 420 is measured and determined to be lower than the voltage on the first electrode 415, which may cause an electric filed non-uniformity (e.g., differences less than about 5%, 10%, 15%, or 20%) on the surface of the wafer. The controller may adjust the pulse width of the control pulse being sent to the second high voltage pulser 430, which may increase the voltage produced by the second high voltage pulser 430 (e.g., by increasing the capacitive charging time) and, therefore, increasing the electric field on the second electrode. The process may repeat until the electric field across the surface of the wafer is uniform (e.g., within 10%, 15%, 20%, 25%, etc.).

As another example, the voltages across a first resistive output stage and a second resistive output stages may be measured. These voltages can correspond to the ion current flowing in the chamber This current may be affected by the electrode voltage. If the ion current to the first electrode and the ion current to the second electrode are nonuniform or misaligned (e.g., a difference greater than 10%, 20% or 30%), then the controller may adjust the pulse width of the control pulse being sent to either the first high voltage pulser 425 or the second high voltage pulser 430, which may increase the voltage produced by the nanosecond pulser (e.g., by increasing the capacitive charging time) and, therefore, increasing the electric field on the corresponding electrode.

In some embodiments, pulses from the first high voltage pulser 425 and the second high voltage pulser 430 may pass to the energy recovery circuit 525 and to the plasma chamber 535 via a chamber interface board or the bias compensation circuit 510. The energy recovery circuit 525, for example, may include the resistive output stage 102 of nanosecond pulser system 100. As another example, the energy recovery circuit 525 may include the energy recovery circuit 305. As another example, the energy recovery circuit 525 may not be required. As another example, an energy recovery circuit 525 may be coupled with either or both the first high voltage pulser 425 or the second high voltage pulser 430. In some embodiments, the plasma chamber 535 may include a plasma chamber, an etch chamber, a deposition chamber, etc. In some embodiments, the effective circuit of the plasma chamber 535 may include load stage 106.

While two high voltage pulsers are shown, any number may be used. For example, multiple rings of electrodes may be coupled with multiple high voltage pulsers.

In some embodiments, the first high voltage pulser 425 may produce pulses that are different than pulses produced by the second high voltage pulser 430. For example, the first high voltage pulser 425 may provide pulses of at least 2 kV of pulsed output. In some embodiments, the second high voltage pulser 430 may provide pulses of at least 2 kV of pulsed output that are either the same or different than the pulses provided by the first high voltage pulser 425.

As another example, the first high voltage pulser 425 may produce pulses with a first pulse repetition frequency and the second high voltage pulser 430 may produce pulses with a second pulse repetition frequency. The first pulse repetition frequency and the second pulse repetition frequency may be the same or different. The first pulse repetition frequency and the second pulse repetition frequency may be in phase or out of phase with respect to each other.

As another example, the first high voltage pulser 425 may produce a first plurality of bursts with a first burst repetition frequency and the second high voltage pulser 430 may produce a second plurality of bursts with a second burst repetition frequency. Each burst may comprise a plurality of pulses. The first burst repetition frequency and the second burst repetition frequency may be the same or different. The first burst repetition frequency and the second burst repetition frequency may be in phase or out of phase with respect to each other.

In some embodiments, the first high voltage pulser 425 and the second high voltage pulser 430 may be water- or dielectric-cooled.

Figure 6:
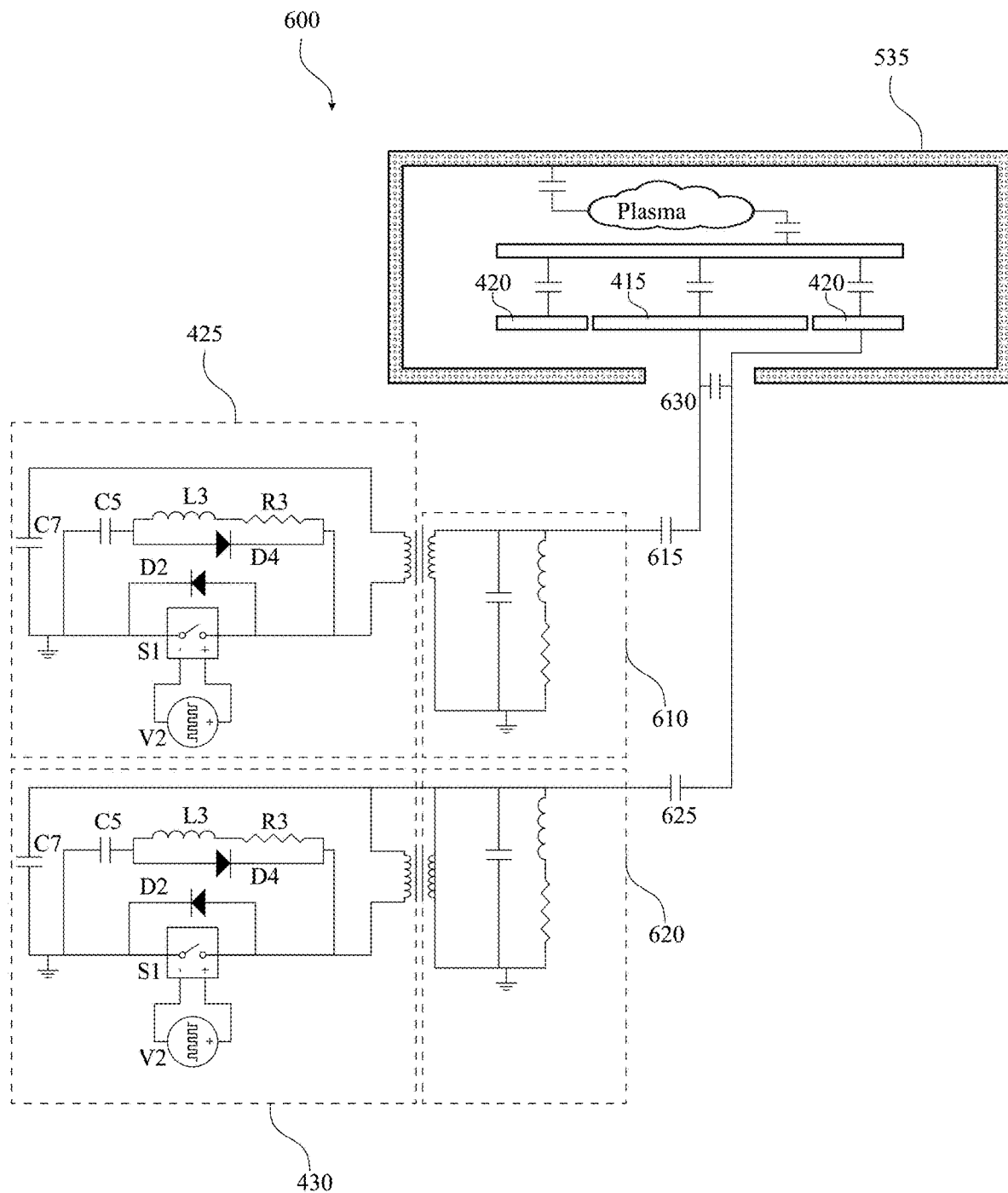
FIG. 6 is a schematic of a spatially variable wafer bias system according to some embodiments.

FIG. 6 is a schematic of a spatially variable wafer bias system 600 according to some embodiments. The spatially variable wafer bias system 600 may include a first high voltage pulser 425 and a second high voltage pulser 430 coupled with a plasma chamber 535.

In this example, the first high voltage pulser 425 includes a first resistive output stage 610 and a first bias capacitor 615. In some embodiments, the first resistive output stage 610 may not be used and an energy recovery circuit may be used such as, for example, as shown in nanosecond pulser system 300.

In this example, the second high voltage pulser 430 includes a second resistive output stage 620 and a second bias capacitor 625. In some embodiments, the second resistive output stage 620 may not be used and an energy recovery circuit may be used such as, for example, as shown in nanosecond pulser system 300.

A first electrode 415 and a second electrode 420 are disposed in the plasma chamber 535. In this example, the first electrode 415 is disc shaped and disposed within a central aperture of the second electrode 420. The first high voltage pulser 425 is electrically coupled with the first electrode 415 and the second high voltage pulser 430 is electrically coupled with the second electrode 420. In some embodiments, a stray coupling capacitance 630 can exist between the first high voltage pulser 425 and the second high voltage pulser 430. The stray coupling capacitance 630, for example, may be less than about 100 pF, about 1 nF, about 10 nF, etc.

Figure 7:
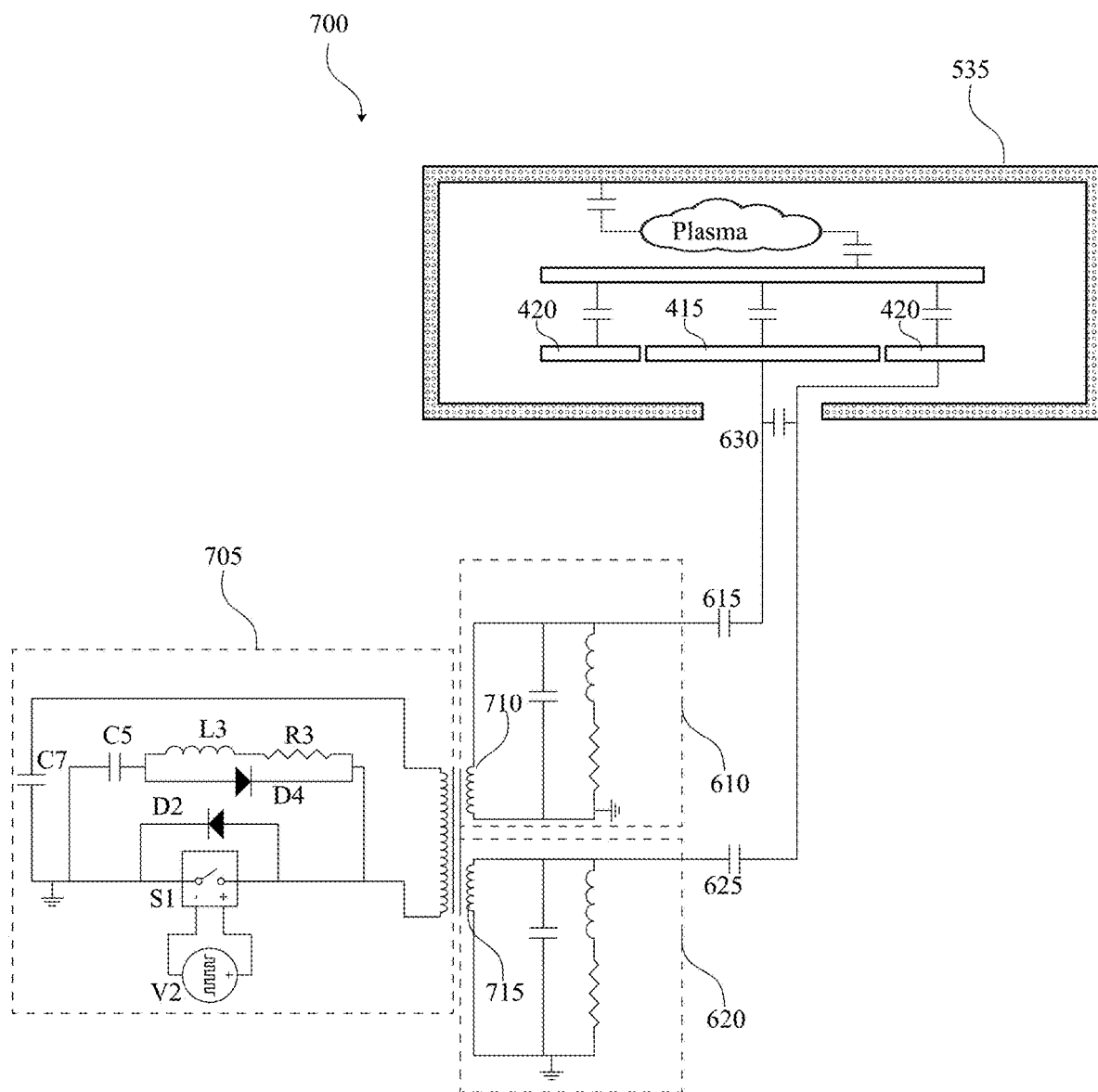
FIG. 7 is a schematic of a spatially variable wafer bias system according to some embodiments.

FIG. 7 is a schematic of a spatially variable wafer bias system 700 according to some embodiments. In this example, the spatially variable wafer bias system 700 utilizes multiple isolated secondary windings to provide different voltages on two different wafer spatial regions. The spatially variable wafer bias system 700 includes a single high voltage pulser 705. The single high voltage pulser 705 may include the pulser and transformer stage 101 shown in FIG. 1 or FIG. 3. In this example, two distinct sets of secondary windings can be wound around the transformer T1. A first secondary winding 710 may be electrically coupled with a first resistive output stage 610 and a first bias capacitor 615 forming a first electrode channel. A second secondary winding 715 may be electrically coupled with a second resistive output stage 620 and a second bias capacitor 625 forming a second electrode channel. In some embodiments, a stray coupling capacitance 630 can exist between the first electrode channel and the second electrode channel. The stray coupling capacitance 630, for example, may be less than about 100 pF, about 1 nF, about 10 nF, etc.

In some embodiments, a first energy recover circuit (e.g., energy recovery circuit 305) can be used instead of the first resistive output stage 610 and a second energy recover circuit (e.g., energy recovery circuit 305) can be used instead of the second resistive output stage 620. The first energy recovery circuit and the second energy recovery circuit may be arranged in parallel.

The voltage on the first electrode 415 and the second voltage on the second electrode 420 may depend on the number of windings of the first secondary windings and the second secondary windings.

Figure 8:
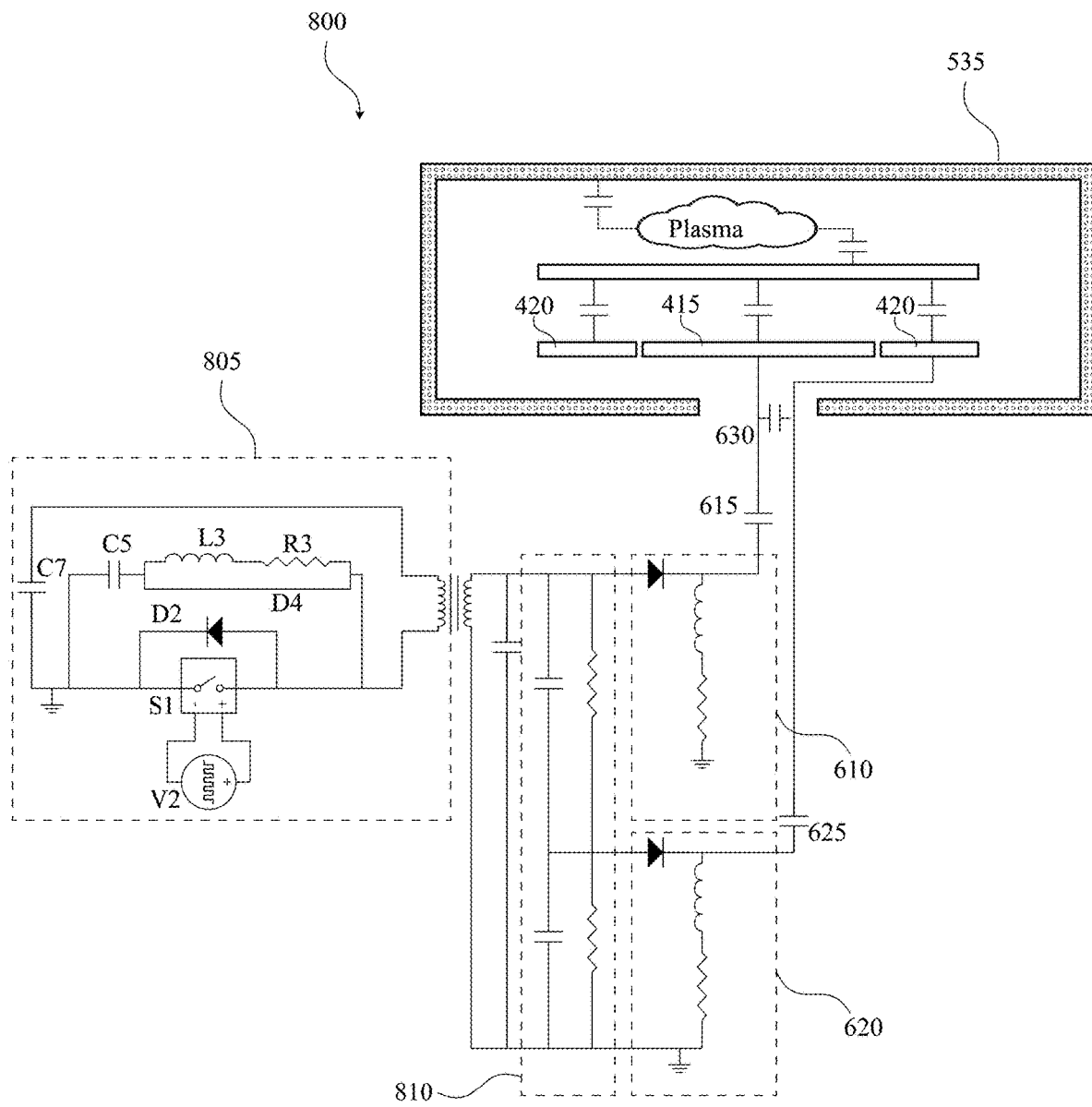
FIG. 8 is a schematic of a spatially variable wafer bias system according to some embodiments.

FIG. 8 is a schematic of a spatially variable wafer bias system 800 according to some embodiments. In this example, the spatially variable wafer bias system 800 utilizes a voltage divider to provide different voltages on two different wafer spatial regions. The spatially variable wafer bias system 800 includes a single high voltage pulser 805 and a voltage divider 810. The voltage divider 810 may include a plurality of resistors and capacitors. The value of the resistors and capacitors can be selected to provide the voltage ratio of the voltage of the pulses provided to the first electrode channel which provides pulses to the first electrode 415 and the voltage of the pulses provided to the second electrode channel which provides pulses to the second electrode 420.

The first electrode channel can include a first resistive output stage 610 and a first bias capacitor 615. The second electrode channel can include a second resistive output stage 620 and a second bias capacitor 625.

In some embodiments, a stray coupling capacitance 630 can exist between the first electrode channel and the second electrode channel. The stray coupling capacitance 630, for example, may be less than about 100 pF, about 1 nF, about 10 nF, etc.

In some embodiments, a first energy recover circuit (e.g., energy recovery circuit 305) can be used instead the first resistive output stage 610 and a second energy recover circuit (e.g., energy recovery circuit 305) can be used instead of the second resistive output stage 620. The first energy recovery circuit and the second energy recovery circuit may be arranged in parallel.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Figure 9:
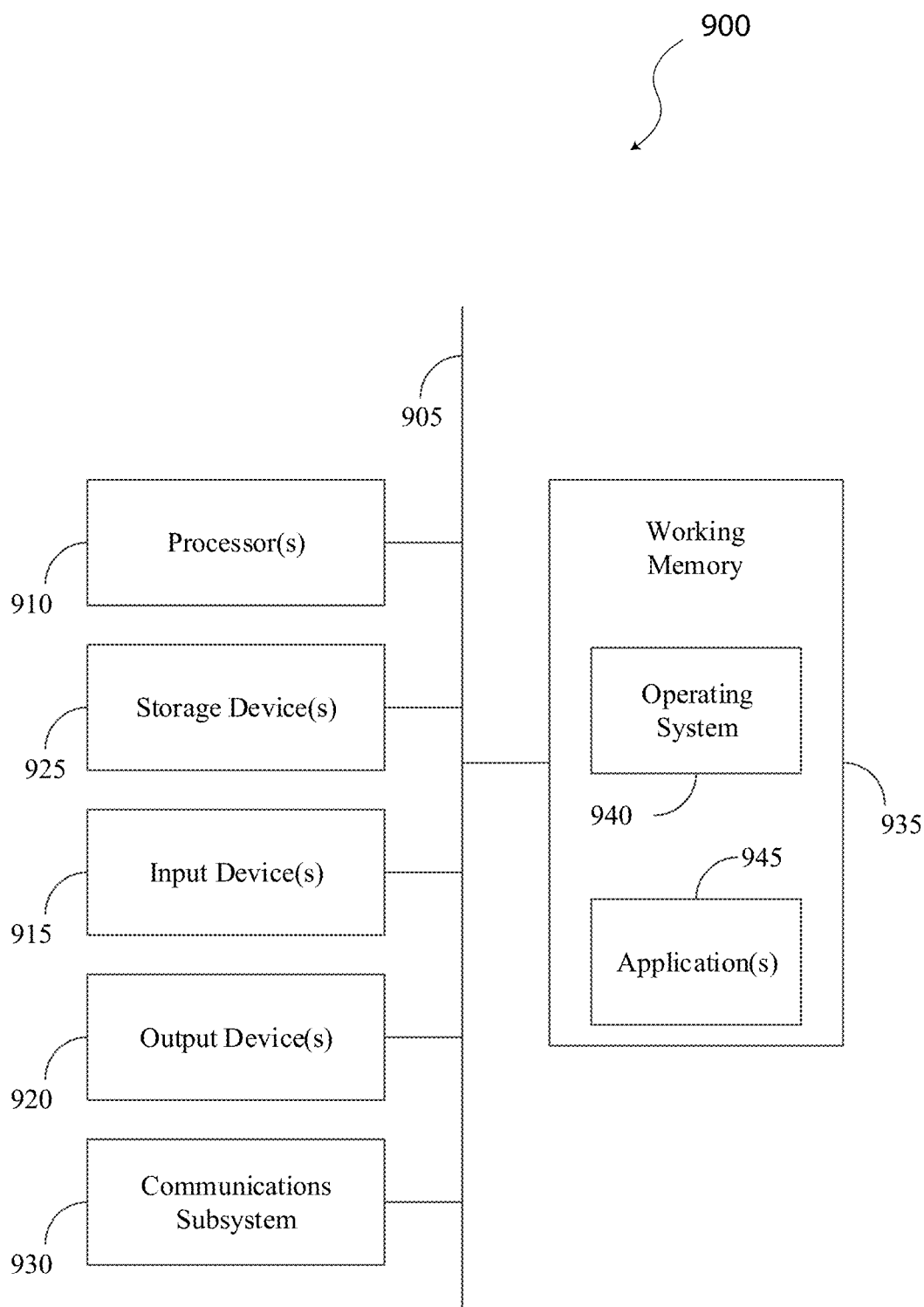
FIG. 9 shows an illustrative computational system for performing functionality to facilitate implementation of embodiments described herein.

The computational system 900, shown in FIG. 9 can be used to perform any of the embodiments of the invention. As another example, computational system 900 can be used perform any calculation, identification and/or determination described here. The computational system 900 includes hardware elements that can be electrically coupled via a bus 905 (or may otherwise be in communication, as appropriate). The hardware elements can include one or more processors 910, including without limitation one or more general-purpose processors and/or one or more special-purpose processors (such as digital signal processing chips, graphics acceleration chips, and/or the like); one or more input devices 915, which can include without limitation a mouse, a keyboard and/or the like; and one or more output devices 920, which can include without limitation a display device, a printer and/or the like.

The computational system 900 may further include (and/or be in communication with) one or more storage devices 925, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 900 might also include a communications subsystem 930, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 930 may permit data to be exchanged with a network (such as the network described below, to name one example), and/or any other devices described herein. In many embodiments, the computational system 900 will further include a working memory 935, which can include a RAM or ROM device, as described above.

The computational system 900 also can include software elements, shown as being currently located within the working memory 935, including an operating system 940 and/or other code, such as one or more application programs 945, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 925 described above.

In some cases, the storage medium might be incorporated within the computational system 900 or in communication with the computational system 900. In other embodiments, the storage medium might be separate from a computational system 900 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 900 and/or might take the form of source and/or installable code, which, upon compilation and/or installation on the computational system 900 (e.g., using any of a variety of generally available compilers, installation programs, compression/decompression utilities, etc.) then takes the form of executable code.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A power system with plasma load comprising:
a first high voltage pulser that outputs a first plurality of pulses having a first voltage greater than about 1 kV, a first pulse width less than about 1 µs, and a first pulse repetion frequency greater than about 20 kHz;
a second high voltage pulser that outputs a second plurality of pulses having a second voltage greater than about 1 kV, a second pulse width less than about 1 µs, and a second pulse repetion frequency greater than about 20 kHz;
a chamber;
a first electrode disposed within the chamber and electrically coupled with the first high voltage pulser, wherein the first electrode comprises:
a disc shape,
a central axis, and
an outer diameter; and
a second electrode disposed within the chamber adjacent with the first electrode and electrically coupled with the second high voltage pulser, wherein the second electrode comprises:
a disc shape with a central aperture, the first electrode disposed within the central aperture;
a central axis aligned with the central axis of the first electrode,
an aperture diameter, and
an outer diameter.

2. The system according to claim 1, wherein the chamber includes either or both a wafer and a plasma that is capacitively coupled with the first electrode and the second electrode with a capacitance between 10 pF and 1 µF.

3. The system according to claim 1, wherein an electric field across the surface of the wafer is uniform within 25%.

4. The system according to claim 1, wherein the coupling capacitance between the first electrode and a corresponding portion of the wafer is greater than 100 pF; and the capacitance between the second electrode and a corresponding portion of the wafer is greater than 100 pF.

5. The system according to claim 1, wherein the chamber includes a plasma of ions that are accelerated onto a wafer.

6. The system according to claim 1, wherein the first high voltage pulser produces an electrode voltage on the first electrode that is greater than about 1 kV, and the second high voltage pulser produces an electrode voltage on the second electrode that is greater than about 1 kV.

7. The system according to claim 1, wherein the ratio of the first voltage relative to the second voltage is less than two to one or vice versa.

8. The system according to claim 1, wherein either or both the first electrode and the second electrode are axially symmetric.

9. The system according to claim 1, wherein the first electrode has a first planar surface and the second electrode has a second planar surface such that the second planar surface is 25% of the total of the first planar surface and the second planar surface.

10. The system according to claim 1, wherein both the first the first high voltage pulser and the second high voltage pulser comprise a resistive output stage.

11. The system according to claim 1, wherein both the first high voltage pulser and the second high voltage pulser comprise an energy recovery circuit.

12. The system according to claim 1, wherein the parameters of the first plurality of pulses are controlled independently of the parameters of the second plurality of pulses.

13. The system according to claim 1, wherein the first pulse repletion frequency and the second pulse repetition frequency are in phase with respect of each other.

14. The system according to claim 1, wherein the coupling capacitance between the first electrode and the second electrode is less than about 10 nF.

15. A system comprising:
a wafer platform;
a first electrode comprises:
  a disc shape,
  a central axis, and
  an outer diameter; and
a second electrode comprises:
  a disc shape with a central aperture, the first electrode disposed within the central aperture;
  a central axis aligned with the central axis of the first electrode,
  an aperture diameter, and
  an outer diameter;
a first high voltage pulser electrically coupled with the first electrode, the first high voltage pulser producing pulses greater than 5 kV with a pulse repetition rate greater than 10 kHz; and
a second high voltage pulser electrically coupled with the second electrode, the second high voltage pulser producing pulses greater than 5 kV with a pulse repetition rate greater than 10 kHz.

16. The system according to claim 15, wherein the wafer platform has an outer diameter that is substantially similar to the outer diameter of the second electrode.

17. The system according to claim 15, wherein the second high voltage pulser provides pulses with an amplitude that is a fraction of the amplitude of the pulses provided by the first high voltage pulser.

18. The system according to claim 15, wherein the second high voltage pulser provides pulses with a pulse repetition frequency that is a fraction of the pulse repetition frequency of the pulses provided by the first high voltage pulser.

19. The system according to claim 15, further comprising: a first resistive output stage coupled with the first high voltage pulser and the first electrode; and a second resistive output stage coupled with the second high voltage pulser and the second electrode.

20. The system according to claim 15, further comprising a bias compensation circuit coupled with the first high voltage pulser and the first electrode.

21. The system according to claim 15, further comprising a ring of insulating material disposed between the first electrode and the second electrode.

22. The system according to claim 15, wherein the wafer platform comprises a dielectric material or a ceramic material.

23. A method comprising:
pulsing a first high voltage pulser coupled with a first electrode in a plasma chamber, the first high voltage pulser pulsing at a first voltage greater than about 1 kV, with a first pulse repetition frequency greater than about 20 kHz, and with a first pulse width;
pulsing a second high voltage pulser coupled with a second electrode in the plasma chamber, the second high voltage pulser pulsing at a second voltage greater than about 1 kV, with a second pulse repetition frequency greater than about 20 kHz, and with a second pulse width, wherein the first electrode and the second electrode are disposed beneath a wafer;
measuring a parameter corresponding with a physical phenomenon occurring within the plasma chamber; and
adjusting at least one of the second voltage, the second pulse repetition frequency, and the second pulser width an amount based on the measured parameter.

24. The method according to claim 23, wherein the physical phenomena occurring within the plasma chamber corresponds with the uniformity of the electric field across a surface of the wafer.

25. The method according to claim 23, wherein the physical phenomena occurring within the plasma chamber corresponds with the uniformity of the ion current across a surface of the wafer.

26. The method according to claim 23, wherein the parameter is the current flowing through a resistor in the first high voltage pulser.

* * * * *